(12) United States Patent
Managaki et al.

(10) Patent No.: US 12,532,598 B2
(45) Date of Patent: Jan. 20, 2026

(54) DISPLAY DEVICE

(71) Applicant: Magnolia White Corporation, Tokyo (JP)

(72) Inventors: Nobuto Managaki, Tokyo (JP);
Takuya Nakagawa, Tokyo (JP);
Ryosuke Murata, Tokyo (JP);
Masakazu Gunji, Tokyo (JP);
Takahiro Ushikubo, Tokyo (JP);
Masashi Tsubuku, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 426 days.

(21) Appl. No.: 18/086,643

(22) Filed: Dec. 22, 2022

(65) Prior Publication Data

US 2023/0209850 A1    Jun. 29, 2023

(30) Foreign Application Priority Data

Dec. 28, 2021   (JP) .................. 2021-213657

(51) Int. Cl.
*H10K 50/11*      (2023.01)
*H10K 101/30*     (2023.01)
*H10K 101/40*     (2023.01)
*H10K 102/00*     (2023.01)

(52) U.S. Cl.
CPC ......... *H10K 50/11* (2023.02); *H10K 2101/30* (2023.02); *H10K 2101/40* (2023.02); *H10K 2102/351* (2023.02)

(58) Field of Classification Search
CPC .............. H10K 50/11; H10K 2101/30; H10K 2101/40; H10K 2102/351; H10K 50/181; H10K 50/15; H10K 50/16; H10K 50/18

See application file for complete search history.

(56) References Cited

U.S. PATENT DOCUMENTS

| 2011/0233525 A1 | 9/2011 | Terao et al. |
| 2013/0207046 A1* | 8/2013 | Pflumm ............... C07D 219/02 252/500 |
| 2025/0098522 A1* | 3/2025 | Tan .................... H10K 85/6572 |

FOREIGN PATENT DOCUMENTS

WO        2009/069434 A1    6/2009

* cited by examiner

*Primary Examiner* — Mohammad A Rahman
(74) *Attorney, Agent, or Firm* — XSENSUS LLP

(57) ABSTRACT

According to one embodiment, a display device includes an anode, an organic EL element layer including a hole injection layer, a hole transport layer, an electron blocking layer, a light-emitting layer, a hole blocking layer, an electron transport layer and an electron injection layer, and a cathode, wherein $\Delta E2\_LUMO$ is defined as a potential barrier between the electron transport layer and the hole blocking layer, and the light-emitting layer, $\Delta E2\_HOMO$ is defined as a potential barrier between the hole transport layer and the electron blocking layer, and the light-emitting layer, and each of $\Delta E2\_LUMO$ and $\Delta E2\_HOMO$ is 0.1 eV or higher and 0.5 eV or less.

6 Claims, 11 Drawing Sheets

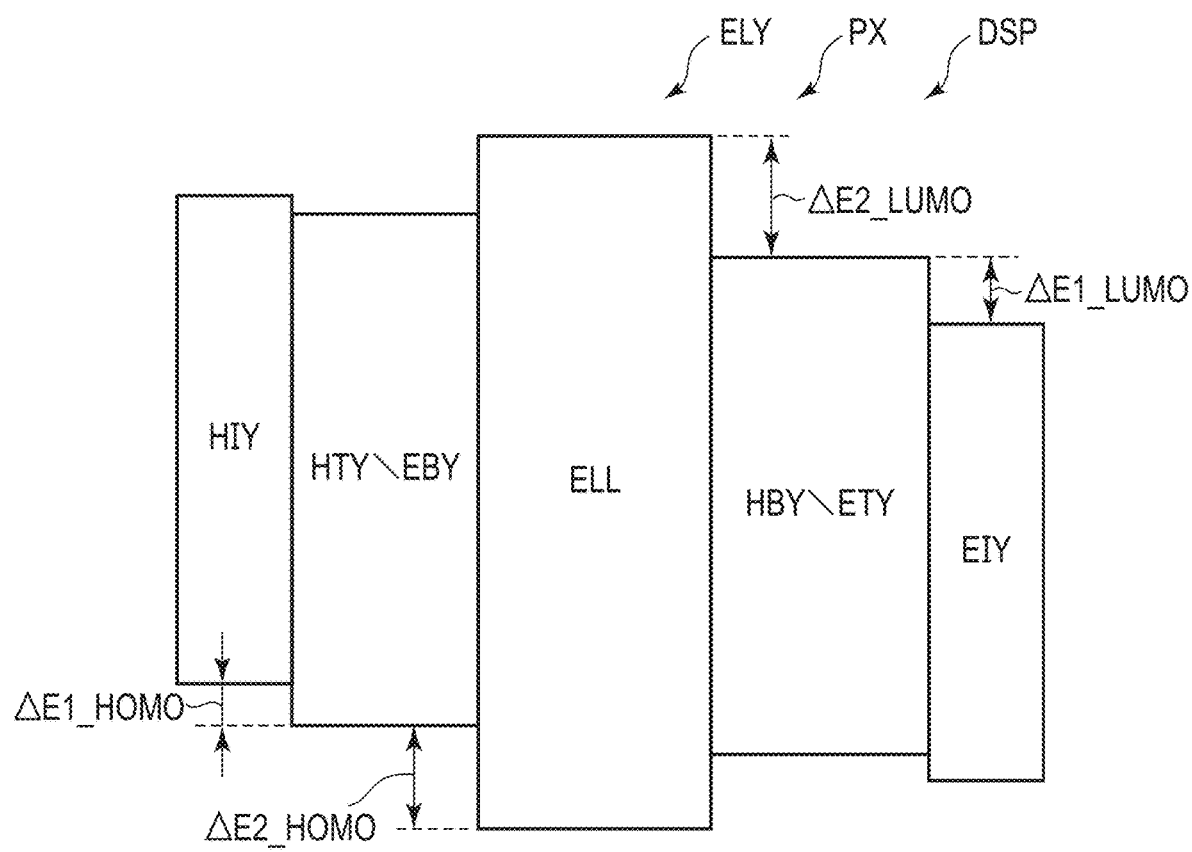
F I G. 7

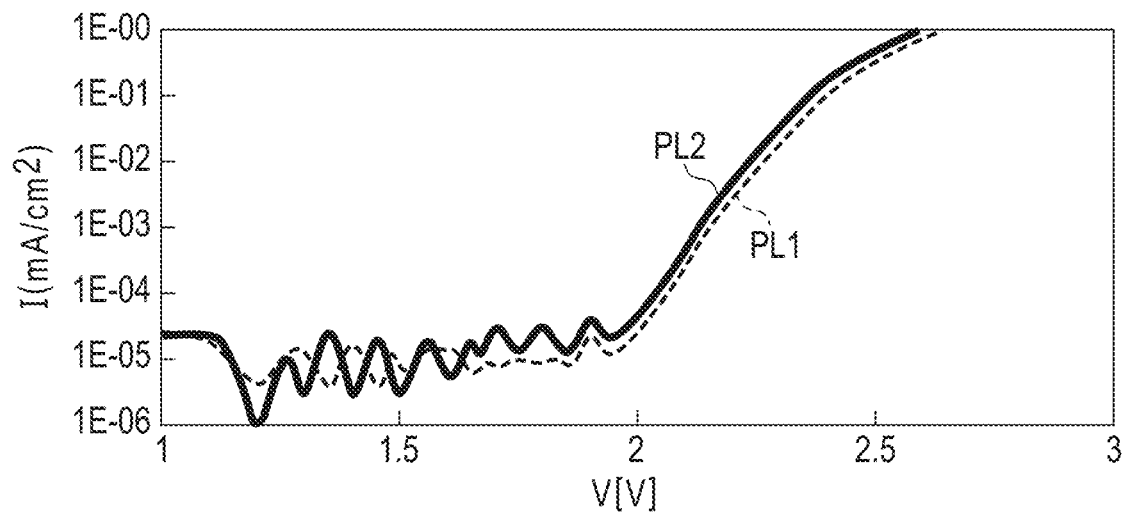
F I G. 12
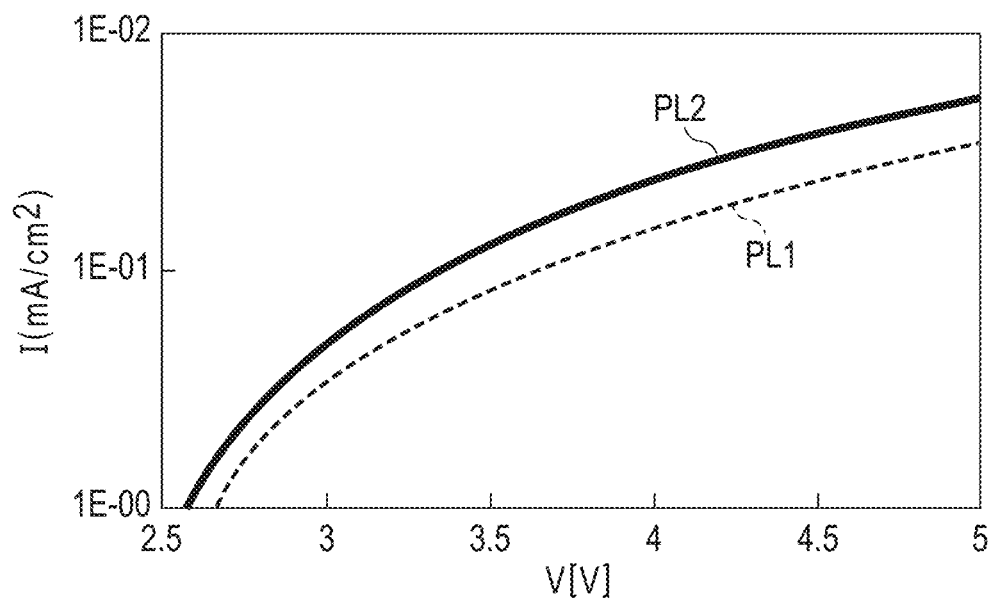
F I G. 13

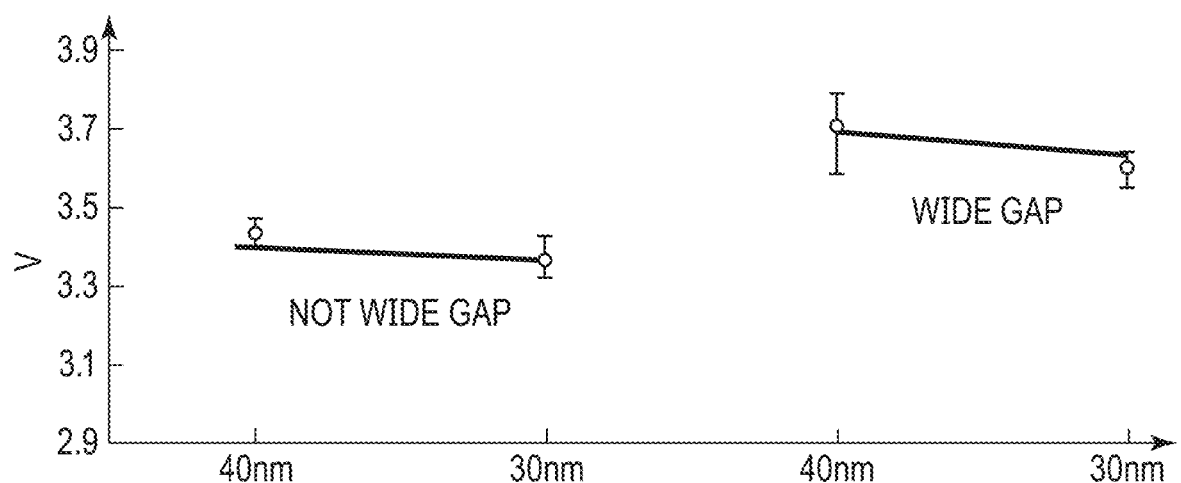
F I G. 14
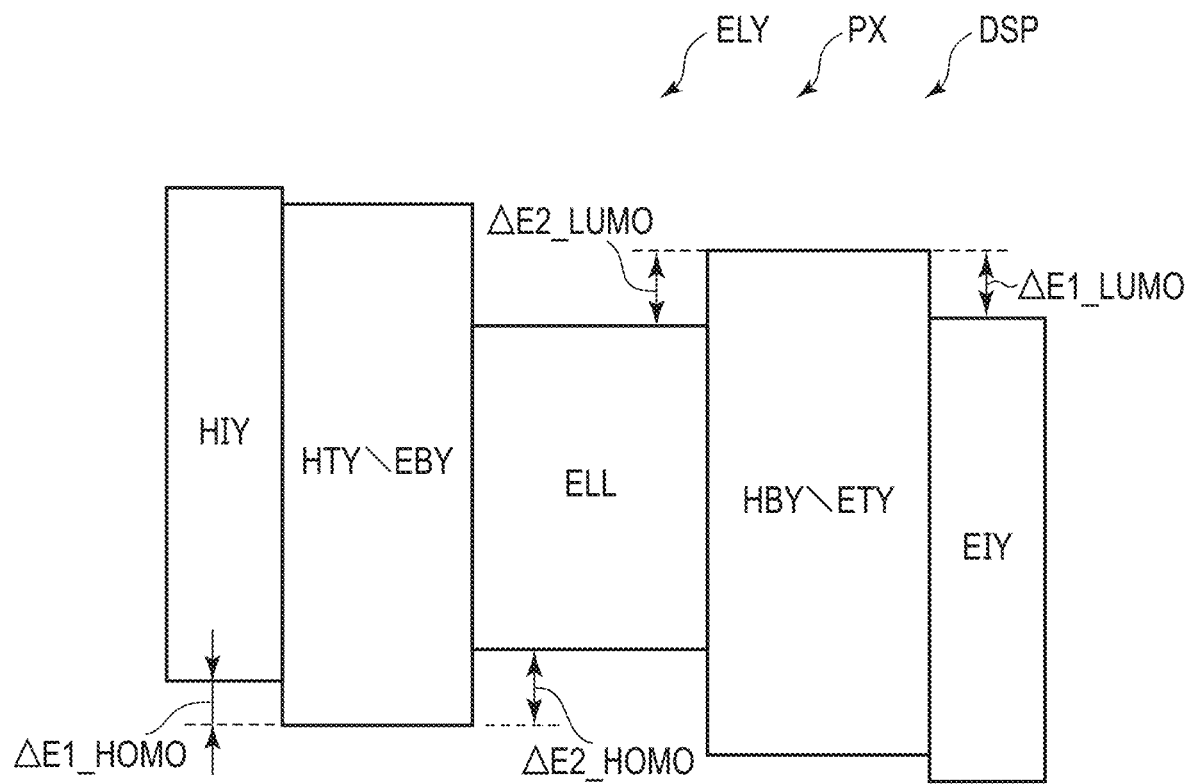
F I G. 15

DISPLAY DEVICE

CROSS-REFERENCE TO RELATED APPLICATIONS

This application is based upon and claims the benefit of priority from Japanese Patent Application No. 2021-213657 filed Dec. 28, 2021, the entire contents of which are incorporated herein by reference.

FIELD

Embodiments described herein relate generally to a display device.

BACKGROUND

In recent years, display devices which uses organic electroluminescent (EL) light-emitting materials have been developed. Such a display device includes an organic EL layer that contains light-emitting materials. In the organic layer of the organic EL element, the light-emitting material is excited by the recombination of electrons and holes, and light emission occurs when the light-emitting material recovers its ground state.

BRIEF DESCRIPTION OF THE DRAWINGS

FIG. 7 is a diagram showing an energy band of a display device having a staggered structure of an embodiment.

FIG. 12 is a diagram showing V-I characteristics of a light-emitting layer containing a dopant used in FIG. 11.

FIG. 13 is a diagram showing V-I characteristics of the light-emitting layer containing the dopant used in FIG. 11.

FIG. 14 is a diagram showing thickness dependency of the emitting layer.

FIG. 15 is a diagram showing an energy band of a display device having a staggered structure of a configuration example 1.

DETAILED DESCRIPTION

Figure 1:
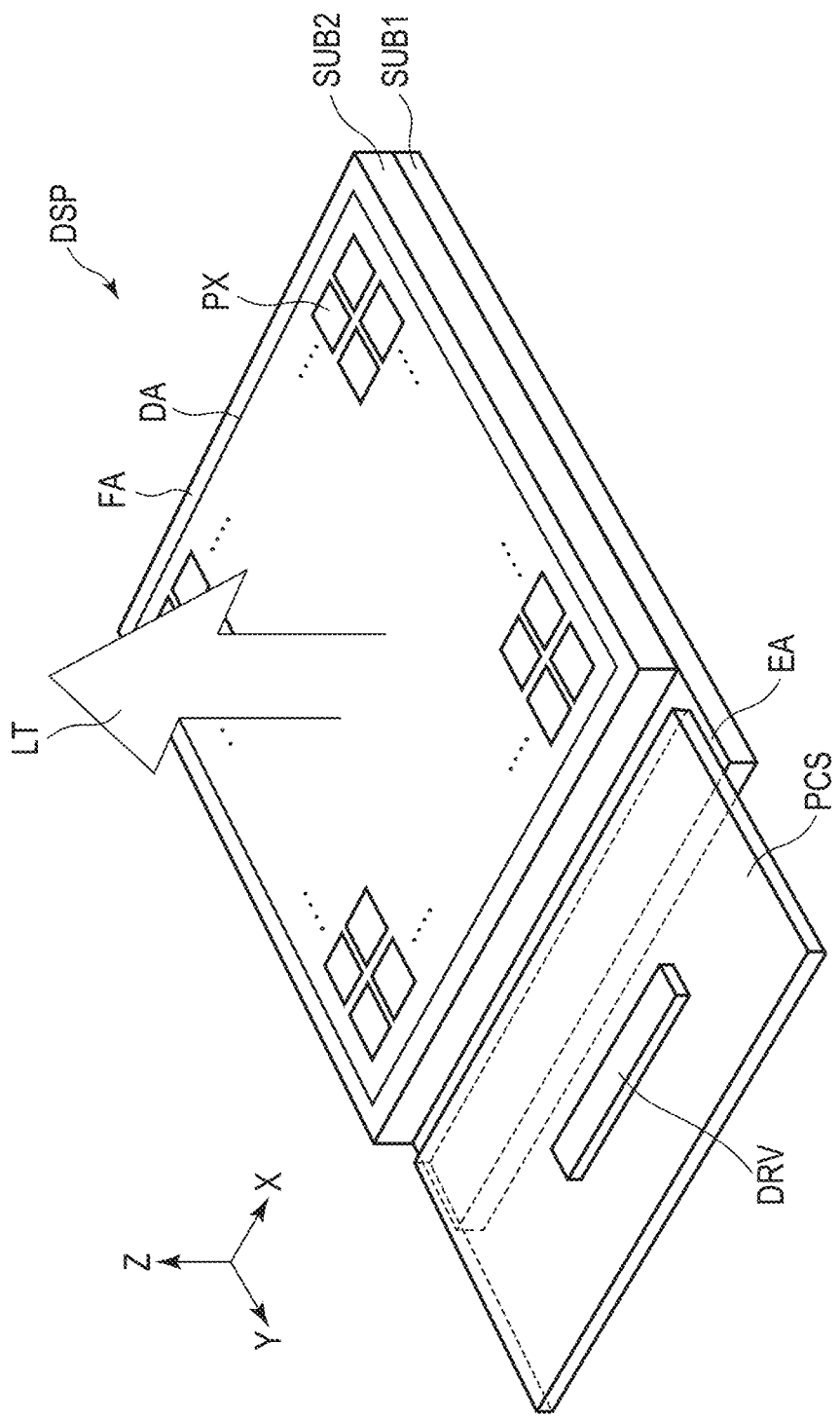
FIG. 1 is an overall perspective view of a display device of an embodiment.

In general, according to one embodiment, a display device comprises an anode; an organic EL element layer including a hole injection layer, a hole transport layer, an electron blocking layer, a light-emitting layer, a hole blocking layer, an electron transport layer and an electron injection layer; and a cathode, wherein $\Delta E2\_LUMO$ is defined as a potential barrier between the electron transport layer and the hole blocking layer, and the light-emitting layer, $\Delta E2\_HOMO$ is defined as a potential barrier between the hole transport layer and the electron blocking layer, and the light-emitting layer, and each of $\Delta E2\_LUMO$ and $\Delta E2\_HOMO$ is 0.1 eV or higher and 0.5 eV or less.

An object of this embodiment is to provide a display device with an improved lifetime in emission light.

Embodiments will be described hereinafter with reference to the accompanying drawings. Note that, throughout the embodiments, common structural elements are denoted by the same symbols and redundant explanations are omitted. Further, the drawings are schematic diagrams to facilitate understanding of the embodiments, and the shapes, dimensions, ratios, etc., may differ from actual conditions, but they may be redesigned as appropriate, taking into account the following descriptions and conventionally known technology.

The followings are detailed descriptions of an illumination device according to one embodiment with reference to the drawings.

In the embodiment, a first direction X, a second direction Y and a third direction Z are orthogonal to each other, but they may intersect at an angle other than 90 degrees. In the following descriptions, a direction forwarding a tip of an arrow indicating the third direction Z is referred to as "upward" or "above" and a direction forwarding oppositely from the tip of the arrow is referred to as "downward" or "below". The first direction X, the second direction Y and third direction Z may as well be referred to as an X direction, a Y direction and a Z direction, respectively.

With such expressions "a second member above a first member" and "a second member below a first member", the second member may be in contact with the first member or may be remote from the first member. In the latter case, a third member may be interposed between the first member and the second member. On the other hand, with such expressions "a second member on a first member" and "a second member on a first member", the second member is meant to be in contact with the first member.

In addition, it is assumed that there is an observation position to observe the semiconductor substrate on a tip side of an arrow in the third direction Z, and viewing from this observation position toward the X-Y plane defined by the first direction X and the second direction Y is referred to as a planar view. Viewing a cross section of the transistor in an X-Z plane defined by the first direction X and the third direction Z or a Y-Z plane defined by the second direction Y and the third direction Z is referred to as a cross-sectional view.

EMBODIMENT

FIG. 1 is an overall perspective view of a display device of an embodiment. The display device DSP comprises, on a substrate SUB1, a display area DA and a peripheral area FA provided around the display area DA. The display device DSP includes a plurality of pixels PX arranged in the display area DA. In the display device DSP, light LT from a rear surface is transmitted to a front surface or vice versa.

On an upper surface of the display area DA, a substrate SUB2 is provided as a sealing member. The substrate SUB2 is fixed to the substrate SUB1 by a sealant (not shown)

provided to surround the display area DA. The display area DA formed on the substrate SUB1 is sealed by the substrate SUB2 as the sealing member, and the sealant, so as not to be exposed to the atmosphere.

An end area EA of the substrate SUB1 is placed outside of the substrate SUB2. In the area EA, a wiring circuit board PCS is provided. The wiring circuit board PCS is provided with a drive element DRV which outputs video signals and drive signals. Signals from the drive element DRV are input to pixels PX in the display area DA via the wiring circuit board PCS. Based on the video signals and various types of control signals, the pixels PX emit light.

Figure 2:
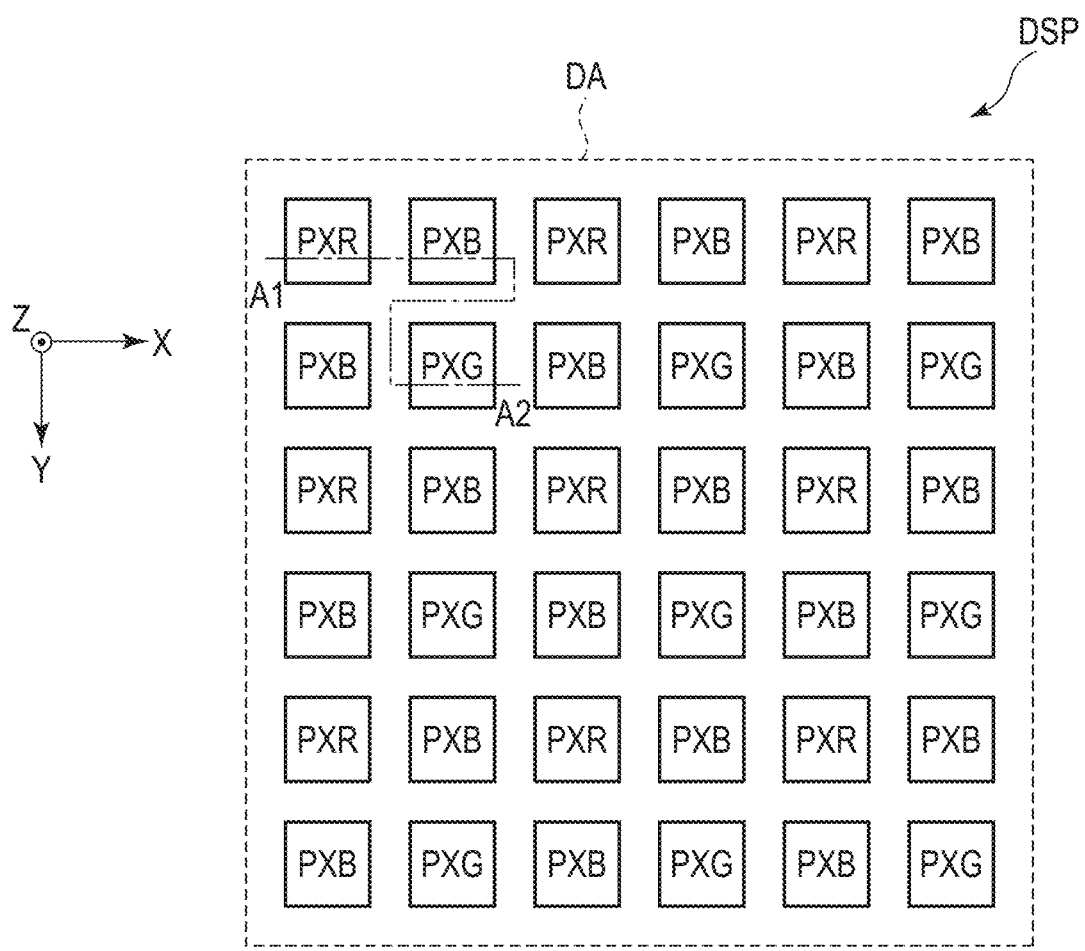
FIG. 2 is a partial plan view schematically showing an example of a configuration of the display device.

FIG. 2 is a partial plan view schematically showing an example of the configuration of the display device. The pixels PX include red-emitting pixels PXR, green-emitting pixels PXG and blue-emitting pixels PXB. The pixels PXR, PXG and PXB are also referred to as a first pixel, a second pixel and a third pixel, respectively. Each pixel PXR is located adjacent to each respective pixel PXB along the first direction X and the second direction Y. Each pixel PXG is located adjacent to each respective pixel PXB along the first direction X and the second direction Y. Each pixel PXB is located adjacent to each respective pixel PXR along the first direction and adjacent to each respective pixel PXG along the second direction Y.

Figure 3:
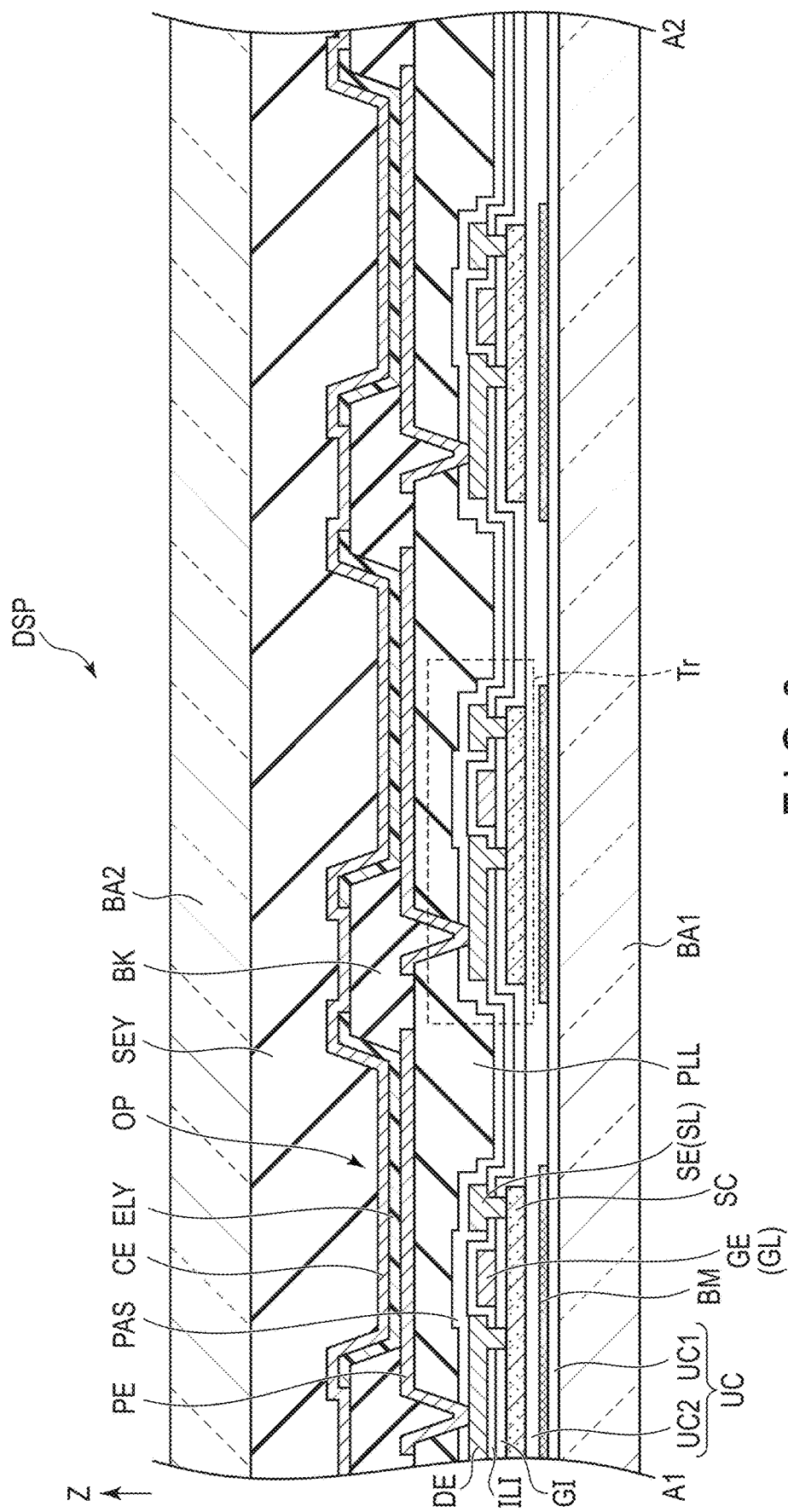
FIG. 3 is a cross-sectional view of the display device shown in FIG. 2 taken along line A1-A2.

FIG. 3 is a cross-sectional view along line A1-A2 of the display device shown in FIG. 2.

A base BA1 is a material made of, for example, glass or a resin material. Examples of the resin material are acrylic, polyimide, polyethylene terephthalate, polyethylene naphthalate and the like, and may be formed of a single layer or a stacked layer of multiple layers of any of those listed.

On the base BA1, an insulating layer UC1 is provided. The insulating layer UC1 is formed from, for example, a single layer of a silicon oxide film or a silicon nitride film or a multilayer of these layers.

On the insulating layer UC1, a light-shielding layer BM may be provided to overlap a transistor Tr. The light-shielding layer BM suppresses changes in transistor characteristics due to the entering of light from a channel backside of the transistor Tr and the like. When the light-shielding layer BM is formed of a conductive layer, it is also possible to impart a back-gate effect to the transistor Tr by applying a predetermined potential.

An insulating layer UC2 is provided to cover the insulating layer UC1 and the light-shielding layer BM. For the insulating layer UC2, a material similar to that of the insulating layer UC1 can be used. The insulating layer UC2 may as well be a material different from that of the insulating layer UC1. For example, silicon oxide can be used for the insulating layer UC1 and silicon nitride can be used for the insulating layer UC2. The insulating layers UC1 and UC2 are collectively referred to as insulating layer UC.

On the insulating layer UC, a transistor Tr is provided. The transistor Tr includes a semiconductor layer SC, an insulating layer GI, a gate electrode GE (scanning line), an insulating layer ILI, a source electrode SE (signal line) and a drain electrode DE.

As the semiconductor layer SC, amorphous silicon, polysilicon or an oxide semiconductor is used.

As the insulating layer GI, for example, silicon oxide or silicon nitride is provided as a single layer or a multilayer thereof.

As the gate electrode GE, for example, a molybdenum-tungsten alloy (MoW) is used. The gate electrode GE may be formed to be integrated with the scanning line GL as one body.

An insulating layer ILI is provided to cover the semiconductor layer SC and the gate electrode GE. The insulating layer ILI is formed, for example, from a silicon oxide layer or silicon nitride layer in a single layer or multilayer thereof.

On the insulating layer ILI, a source electrode SE and a drain electrode DE are provided. The source electrode SE and the drain electrode DE are connected to a source region and a drain region of the semiconductor layer SC through contact holes provided in the insulating layer ILI and the insulating layer GI, respectively. The source electrode SE may be formed to be integrated with the signal line as one body.

An insulating layer PAS is provided to cover the source electrode SE, the drain electrode DE and the insulating layer ILI. An insulating layer PLL is provided to cover the insulating layer PAS.

The insulating layer PAS is formed using an inorganic insulating material. The inorganic insulating material is formed of, for example, silicon oxide or silicon nitride in a single layer or multilayer thereof. The insulating layer PLL is formed using an organic insulating material. Examples of the organic insulating material are organic materials such as photosensitive acrylic, polyimide and the like. By providing the insulating layer PLL, steps caused by transistor Tr can be planarized.

A pixel electrode PE is provided on the insulating layer PLL. The pixel electrode PE is connected to the drain electrode DE via a contact hole made in the insulating layers PAS and PLL.

The pixel electrode PE is formed to have a three-layer structure of, for example, indium zinc oxide (IZO), silver (Ag) and IZO.

In this embodiment, the structure from the base BA1 to the insulating layer PLL is defined as a backplane BPS.

Between each adjacent pair of pixel electrodes PE, a bank BK (to be referred to as a protruding portion or rib) is provided. As the material for the bank BK, an organic material similar to that of the insulating layer PLL is used. The bank BK is opened to expose a part of the pixel electrode PE. Further, an end portion of the opening OP should preferably be gently tapered in cross-sectional view. If the end portion of the opening OP has a steep shape, coverage errors will occur in an organic EL layer ELY to be formed later.

Between each adjacent pair of banks BK, an organic EL layer ELY is provided to overlap the respective pixel electrode PE. The organic EL element ELY includes a hole injection layer HIY, a hole transport layer HTY, an electron blocking layer EBY, an emitting layer ELL, a hole blocking layer HBY, an electron transport layer ETY and an electron injection layer EIY.

On the organic EL layer ELY, a common electrode CE is provided. As the common electrode CE, a magnesium-silver alloy (MgAg) film is formed into a thin film through which the light emitted from the organic EL element layer ELY can be transmitted. In this embodiment, each pixel electrode PE serve as an anode and each common electrode CE serve as a cathode. The emission light generated in the organic EL layer ELY is extracted upward via the common electrode CE. In other words, the display device DSP has a top emission structure.

An insulating layer SEY is provided to cover the common electrode CE. The insulating layer SEY has the function of preventing moisture from entering the organic EL layer ELY from outside. As the insulating layer SEY, a material with high gas barrier property is suitable. As the insulating layer SEY, for example, an insulating layer having a configuration in which an organic insulating layer is interposed between two inorganic insulating layers containing nitrogen. Examples of the material for the organic insulating layer include acrylic resin, epoxy resin, polyimide resin and the like. Examples of the material for the nitrogen-containing inorganic insulating layers include silicon nitride, aluminum nitride and the like.

On the insulating layer SEY, a base BA2 is provided. The base BA2 is formed of a material similar to that of the base BA1. Between the base BA2 and the insulating layer SEY, a translucent inorganic insulating layer or translucent organic insulating layer may be provided. The organic insulating layer may have the function of adhering the insulating layer SEY and the base BA2 together.

Figure 4:
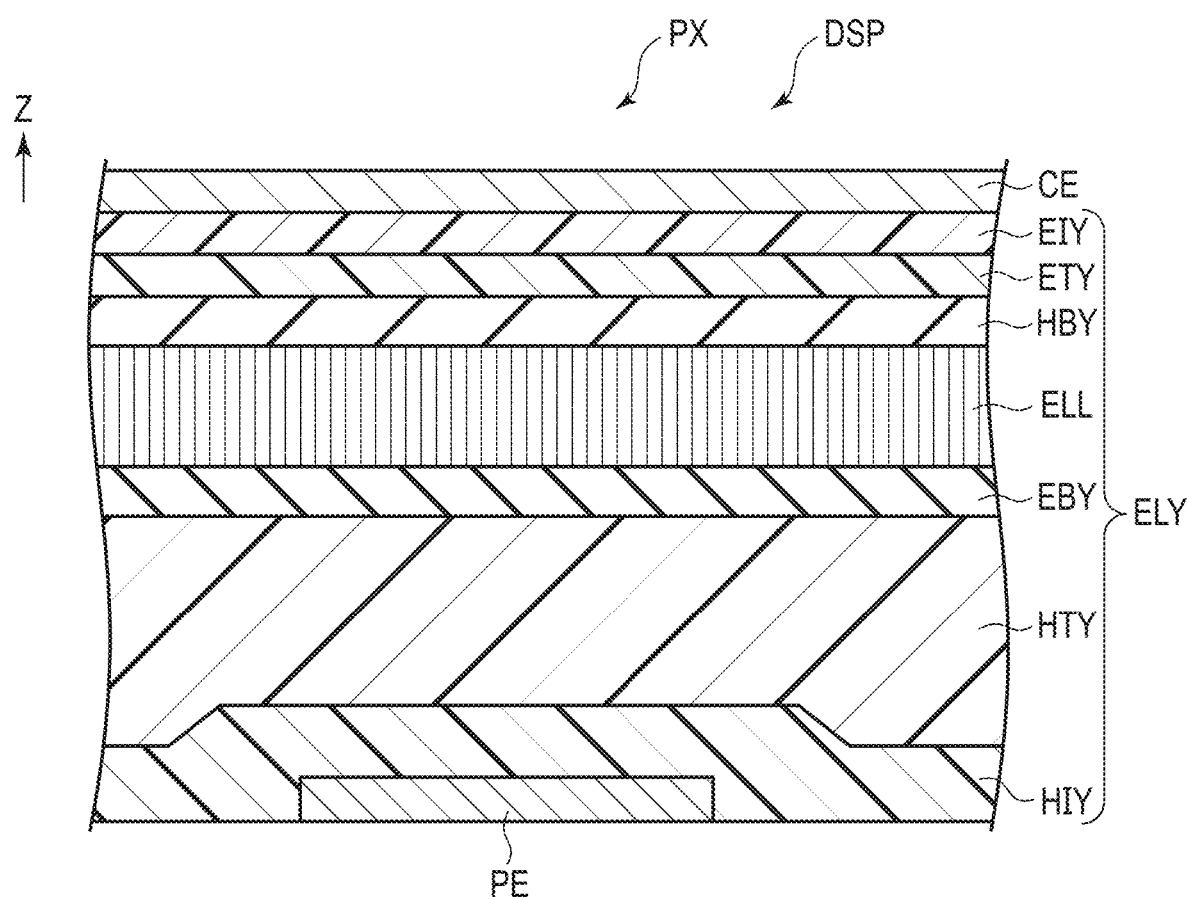
FIG. 4 is a partially enlarged cross-sectional view illustrating a pixel electrode, an organic EL layer and a common electrode.

FIG. 4 is a partially enlarged cross-sectional view illustrating the pixel electrode, the organic EL layer and the common electrode. FIG. 4 shows the structural elements in the pixel PX, from the pixel electrode PE to the common electrode CE. Note that the bank BK is omitted from the illustration.

The pixel PX includes, on the pixel electrode PE, a hole injection layer HIY, a hole transport layer HTY, an electron blocking layer EBY, an emitting layer ELr (ELL), a hole blocking layer HBY, an electron transport layer ETY, an electron injection layer EIY and a common electrode CE.

The light emission in the organic EL element layer ELY is obtained by the following mechanism. That is, a positive hole injected to the highest occupied molecular orbital (HOMO, generally measured as ionization potential) of the material of the light-emitting layer ELL, and an electron injected to the lowest unoccupied molecular orbital (LUMO, generally measured as electron affinity) generate an exciton, and when the excitation energy of the exciton is relaxed, light is emitted.

The hole injection layer HIY, the hole transport layer HTY, the electron blocking layer EBY, the hole blocking layer HBY, the electron transport layer ETY, the electron injecting layer EIY and the common electrode CE are provided over the entire surfaces of multiple pixels PX. Thus, these layers are formed as the so-called mat films.

The material of the hole injection layer HIY is of a type with high efficiency in hole injection from the anode (pixel electrode PE). The hole transport layer HTY transports the injected holes to the emitting layer ELL. The electron blocking layer EBY retains electrons injected from the cathode (common electrode CE) in the emitting layer ELL, and inhibits the electrons from leaking out of the hole transport layer HTY.

The electron injection layer EIY injects electrons from the anode, and the electron transport layer ETY transports the injected electrons to the emitting layer ELL. The hole blocking layer HBY holds the holes injected from the anode in the emitting layer ELL and inhibits the holes from leaking out to the electron transport layer ETY.

In the pixel PX of this embodiment, light from the light-emitting layer ELL is emitted upward or downward. The light emitted upward is taken out to the outside via the common electrode CE. Note that the light emitted downward may be reflected by a reflective layer provided on the pixel electrode PE. The common electrode CE may as well be provided with a reflective layer so as to reflect the reflected light between the pixel electrode PE and the common electrode CE. In this manner, of the light emitted by the light-emitting layer ELL, only the light component of the resonance wavelength is amplified. As a result, light with high peak intensity and spectrum of a narrow width can be extracted, making it possible to expand the color reproduction range of the display device DSP (the microcavity effect).

Further, by reducing the hole injection barrier from the pixel electrode PE (anode) (that is, the difference between the work function of the anode and the HOMO level of the material of the hole transport layer HTY) in the hole injection layer HIY and the hole transport layer HTY, holes can be allowed to flow smoothly.

In the electron injection layer EIY or the electron transport layer ETY, by reducing the electron injection barrier from the common electrode CE (cathode) (that is, the difference between the work function of the cathode and the LUMO level of the material of an adjacent electron transport layer ETY), electrons can be allowed to flow smoothly.

Figure 5:
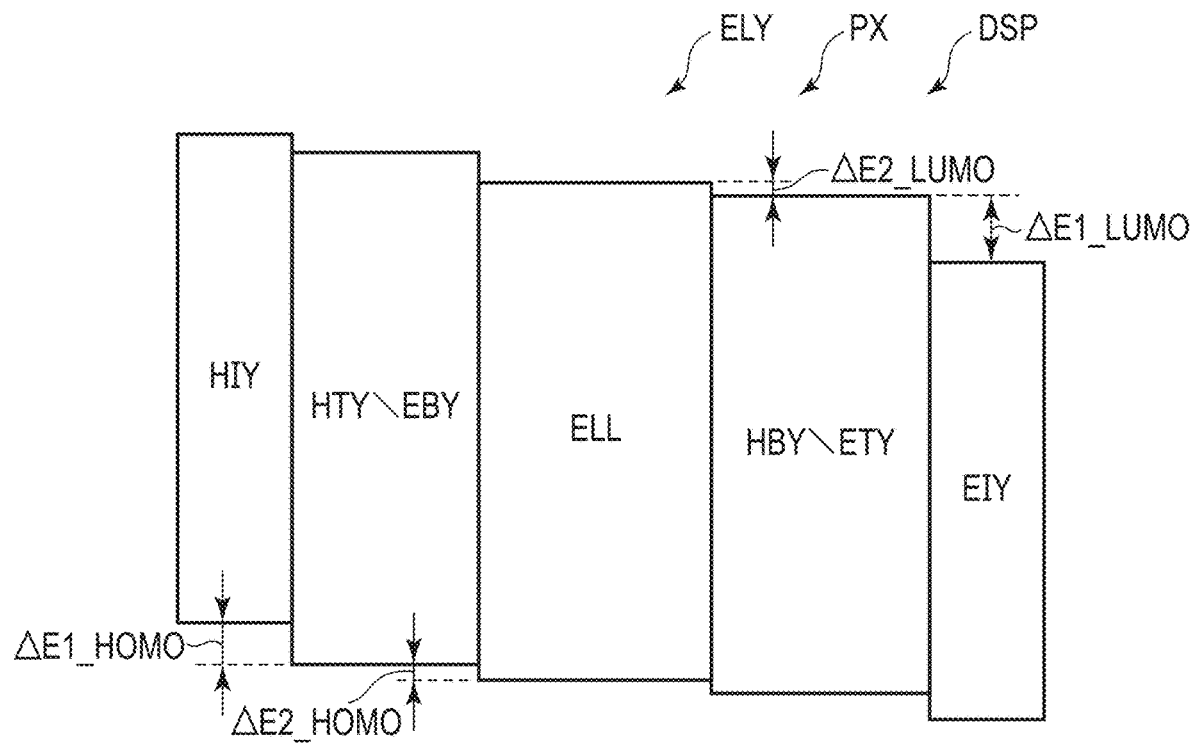
FIG. 5 is a diagram showing an energy band of a display device of comparative example 1.

FIG. 5 is a diagram showing the energy bands of a display device of Comparative Example 1.

When the hole transport layer HTY is provided between pixel electrodes PE (anodes) and the light-emitting layer ELL, the hole injection material and the hole transport material are selected to form a step-like potential barrier at the interface of each pair of layers from the Fermi level of the pixel electrode PE to the HOMO level of the light-emitting layer ELL, so as to carry out the hole injection and hole transport from the pixel electrode PE more effective. Such a step-like potential barrier is referred to as a staggered structure.

Similarly, when the electron transport layer ETY is provided between the common electrode CE (cathode) and the light-emitting layer ELL, the hole injection material and the hole transport material are selected to form a step-like potential barrier at the interface of each pair of layers from the Fermi level of the common electrode CE to the LUMO level of the light-emitting layer ELL, so as to carry out the hole injection and hole transport from the common electrode CE more effective. With the step-like potential barrier, the properties of carrier injection to the light-emitting layer ELL can be improved, and the light emission performance can be enhanced.

Here, the potential barrier between the electron injection layer EIY, and the electron transport layer ETY and the hole blocking layer HBY is defined as $\Delta E1\_LUMO$. The potential barrier between the electron transport layer ETY and the hole blocking layer HBY, and the emitting layer ELL is defined as $\Delta E2\_LUMO$.

Further, the potential barrier between the hole injection layer HIY, and the hole transport layer HTY and the electron blocking layer EBY is defined as $\Delta E1\_HOMO$. The potential barrier between the hole transport layer HTY and the electron blocking layer EBY, and the emitting layer ELL is defined as $\Delta E2\_HOMO$.

When pathways for hole transportation, that is, $\Delta E1\_HOMO$ and $\Delta E2\_HOMO$, and pathways for electron transportation, that is, $\Delta E1\_LUMO$ and $\Delta E2\_HOMO$, are made as small as possible, carriers flow smoothly and the voltage (V)-current (I) characteristic (which is referred to as VI characteristics) of the pixel PX are improved.

Figure 6:
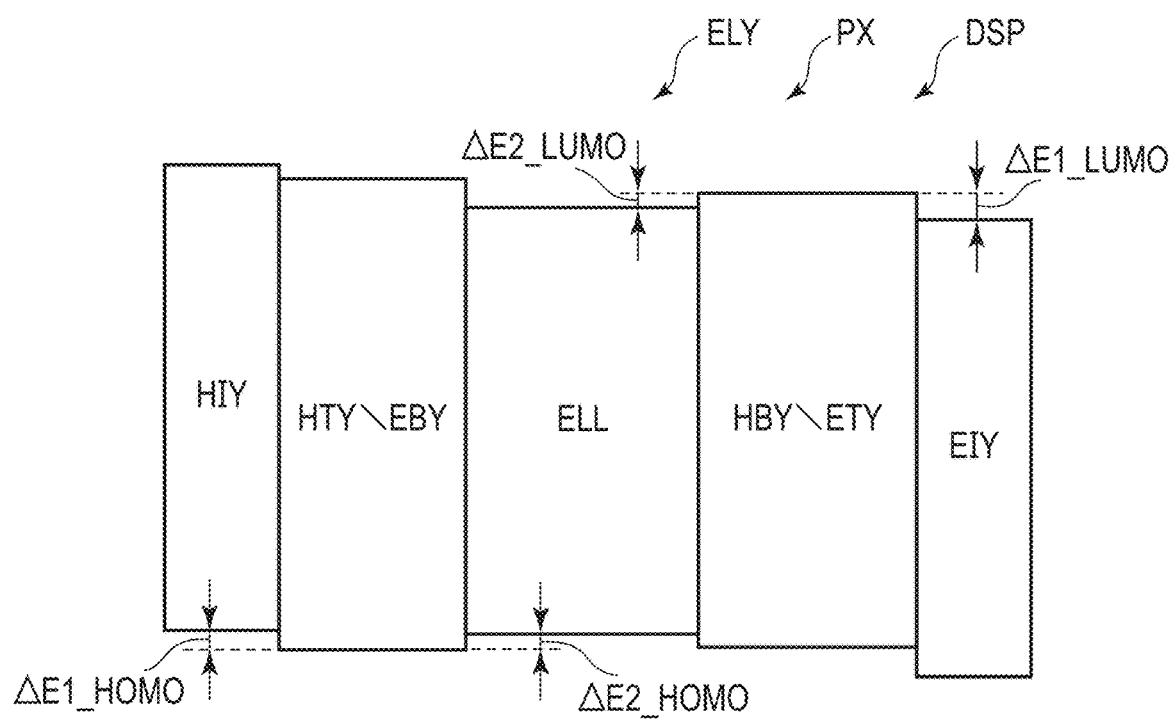
FIG. 6 is a diagram showing an energy band of a display device of comparative example 2.

FIG. 6 is a diagram showing the energy bands of a display device of a comparative example 2. In FIG. 6, the HOMO level of the light-emitting layer ELL and the HOMO levels of the carrier transport layers adjacent thereto (that is, the hole transport layer HTY and the electron transport layer ETY) are compared, and the HOMO levels of the carrier transport layers are lower. The LUMO level of the light-emitting layer ELL and the LUMO levels of the carrier transport layers adjacent thereto (that is, the hole transport layer HTY and the electron transport layer ETY) are compared, and the LUMO levels of the carrier transport layers are higher. The potential barriers shown in FIG. 6 are referred to as a well-like structure.

In FIG. 6 as well, the hole transportation pathways are ΔE1_HOMO and ΔE2_HOMO, and the electron transportation pathways are ΔE1_LUMO and ΔE2_LUMO.

As mentioned above, in order to allow the current to flow smoothly, the ΔE1_HOMO, ΔE2_HOMO, ΔE1_LUMO and ΔE2_LUMO, and ΔE2_LUMO should be as small as possible.

However, if ΔE2_HOMO and ΔE2_LUMO are excessively small, the V-I characteristics of the organic EL element layer ELY may deteriorate. One of the possible reasons for this is that the recombination of electrons and holes in the emitting layer ELL is proportional to the square of the carriers, and therefore if the emitting layer ELL loses its functions as a barrier layer, the confinement of carriers is weakened. In other words, the advantage that carriers can easily flow into the light-emitting layer ELL may as well be a disadvantage that carriers can easily flow out of the light-emitting layer ELL.

Under these circumstances, in this embodiment, the carriers are confined by making the light-emitting layer ELL wide-gap. With this configuration, it difficult for carriers to flow from the light-emitting layer ELL, thereby making it possible to improve the lifetime in light emission of the organic EL element layer ELY.

Figure 8:
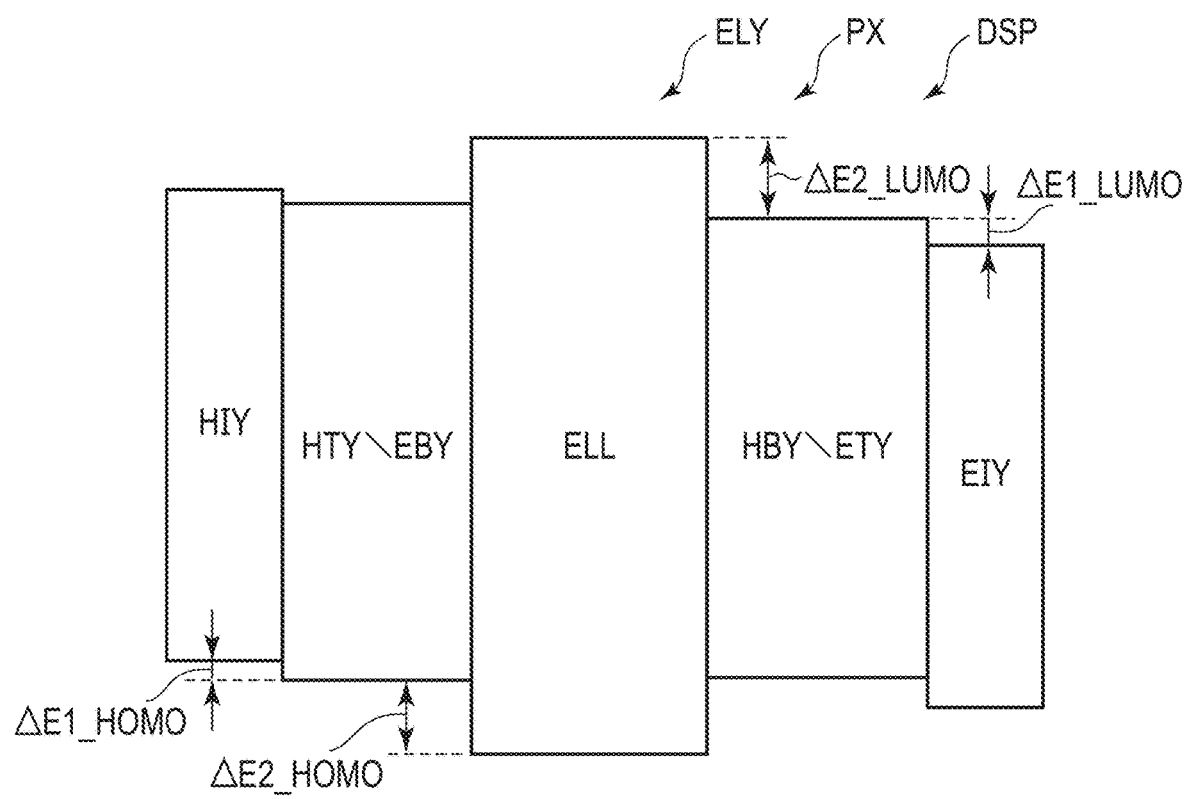
FIG. 8 is a diagram showing an energy band of a display device having a well-shaped structure of an embodiment.

FIG. 7 is a diagram showing the energy bands of the display device having a staggered structure of this embodiment. FIG. 8 is a diagram showing the energy band of the display device having a well-like structure of this embodiment.

In FIGS. 7 and 8, the HOMO level of the light-emitting layer ELL and the HOMO level of the carrier transport layers adjacent thereto (the hole transport layer HTY and the electron blocking layer EBY, and the electron transport layer ETY and the hole blocking layer HBY) are compared, and the HOMO level of the light-emitting layer ELL is lower. Further, the LUMO level of the light-emitting layer ELL and the LUMO level of the carrier transport layers adjacent thereto (the hole transport layer HTY and the electron transport layer ETY) are compared, and the LUMO level of the light-emitting layer ELL is higher.

ΔE2_LUMO, which is the potential barrier between the electron transport layer ETY and the hole blocking layer HBY, and the emitting layer ELL, and ΔE2_HOMO, which is the potential barrier between the electron transport layer ETY and the hole blocking layer HBY, and the light-emitting layer ELL, will be referred to as ΔE2 when they are not particularly required to be distinguished. It is preferable that ΔE2 should be 0.1 eV or higher and 0.5 eV or lower (0.1 eV≤ΔE2≤0.5 eV). If ΔE2 is lower than 0.1 eV (ΔE2<0.1 eV), carriers can easily flow, as explained in FIGS. 5 and 6. This results in a longer lifetime in light emission of excitons, causing lower efficiency.

In order to keep ΔE2 in the above-specified range, a material that can make the emitting layer ELL wide gap (hereinafter referred to as a wide gap material) should be co-deposited when forming the emitting layer ELL. Further, in order to keep ΔE2 within the above range, it is necessary to select appropriate materials and to make the film thickness appropriate.

Note that it suffices if at least one of ΔE2_LUMO and ΔE2_HOMO HOMO is 0.1 eV or higher and 0.5 eV or less, both of ΔE2_LUMO and ΔE2_HOMO do not have to satisfy the above conditions. But both ΔE2_LUMO and ΔE2_HOMO HOMO may satisfy the above conditions.

ΔE1_LUMO, which is the potential barrier between the electron injection layer, and, the electron transport layer ETY and the hole blocking layer HBY, and, ΔE1_HOMO, which is the potential barrier between the hole injection layer HIY, and, the hole transport layer HTY and the electron blocking layer EBY will be referred to as ΔE1 when they are not particularly required to be distinguished. It is preferable that ΔE1 should be 0.5 eV or lower (ΔE1≤0.5 eV). Further, ΔE1 should more preferably be 0.35 eV or lower (ΔE1≤0.35 eV). Furthermore, when ΔE1_LUMO≤0.2 eV, the optimal structure is obtained. The work function of the electrode CE in contact with the electron injection layer EIY is assumed on that ΔE1_LUMO is 3.5 eV.

The film thickness for confinement of carriers is affected by the lower one of holes and electrons in mobility. For example, let us consider the case where the mobility of electrons is lower than that of holes. When the mobility of electrons is $1\times10^{-6}$ cm$^2$/Vs, the film thickness should preferably be 30 nm or more and 40 nm or less. When the mobility of electrons is $1\times10^{-10}$ cm$^2$/Vs, the film thickness should preferably be 20 nm or more and 30 nm or less.

Figure 9:
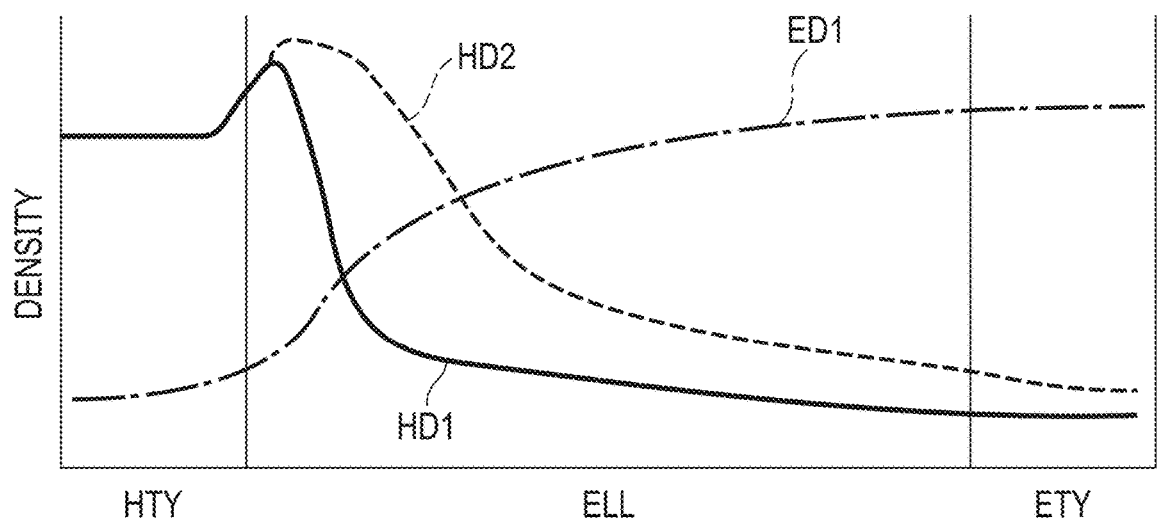
FIG. 9 is a diagram showing a hole density and electron density in each of a hole transport layer, a light-emitting layer and an electron transport layer.

FIG. 9 is a diagram showing the hole density and electron density in the hole transport layer, the light-emitting layer and the electron transport layer. The horizontal axis of FIG. 9 represents the regions of the hole transport layer HTY, the light-emitting layer ELL, and the electron transport layer ETY. The vertical axis of FIG. 9 represents the densities of holes and electrons (DENSITY). In the hole transport layer HTY, the emitting layer ELL, and the electron transport layer shown in FIG. 9, the electron density is represented by ED1, and the hole densities are represented by HD1 and HD2, respectively. The hole density HD2 is higher than the hole density HD1.

Both the hole densities HD1 and HD2 take the respective maximum values in the vicinity of the boundary between the hole transport layer HTY and the emitting layer ELL. As described above, for example, by co-depositing a material which can raise the hole density higher to form the emitting layer ELL, it is possible to obtain the maximum value in the vicinity of the boundary between the hole transport layer HTY and the light-emitting layer ELL.

In order to make the hole density HD2 higher than the hole density HD1, ΔE2 should be higher. The light-emitting layer ELL which exhibits the hole density HD2 has a concentration of the wide-gap material higher than that of the emitting layer ELL which exhibits the hole density HD1. The wide-gap material can be co-deposited with the material of the emitting layer ELL as described above.

Figure 10:
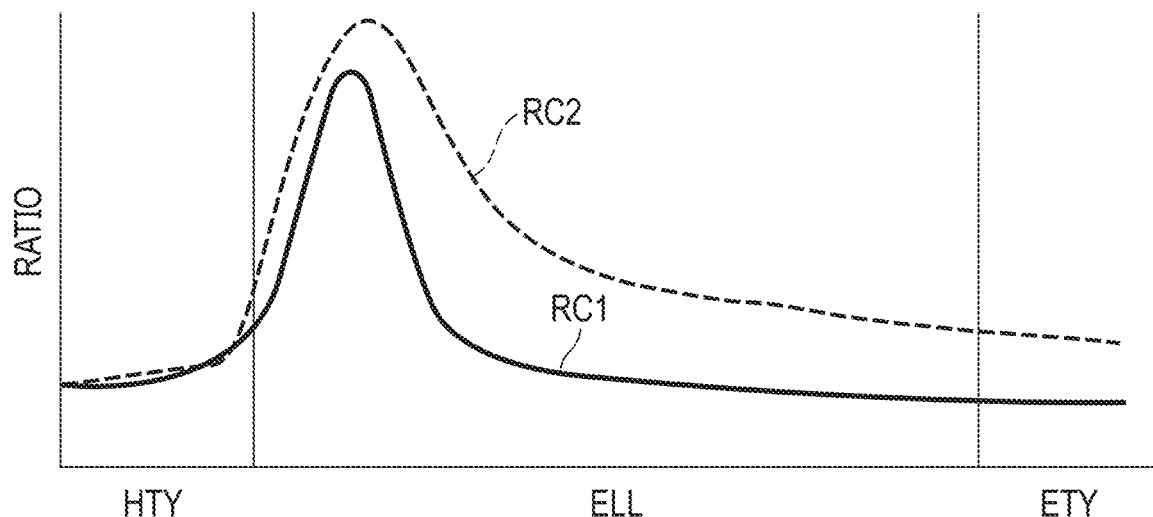
FIG. 10 is a diagram showing a difference in the ratio of emission light recombination based on the hole density illustrated in FIG. 9.

FIG. 10 is a diagram showing the difference in ratio in the recombination in light emission based on the hole density in FIG. 9. The horizontal axis of FIG. 10 represents the regions of the hole transport layer HTY, the light-emitting layer ELL and the electron transport layer ETY. The vertical axis of FIG. 10 represents the ratio in recombination in light emission (RATIO). The recombination ratios RC1 and RC2 shown in FIG. 10 correspond to the hole densities HD1 and HD2, respectively. Note that in FIG. 10, the electron density ED1 is common.

The ratio RC2 in the recombination in the light-emitting layer ELL which indicates the hole density HD2 is higher than the ratio RC1 of the recombination in the light-emitting layer ELL which indicates the hole density HD1. In other words, when ΔE2 is higher, the recombination between holes and electrons can more easily occur, thus improving the light-emission efficiency.

Figure 11:
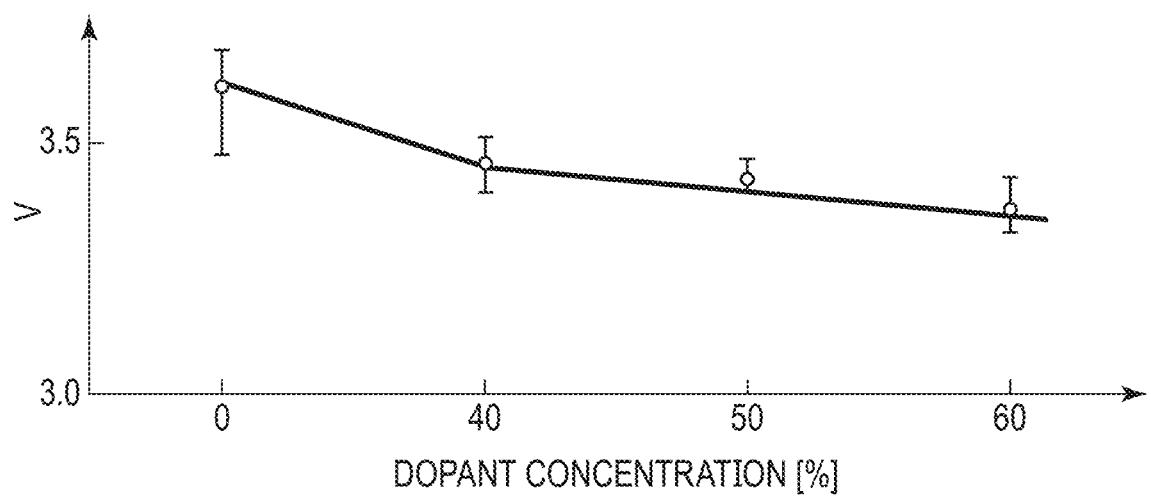
FIG. 11 is a diagram showing a relationship between voltage and concentration of a wide-gap material.

FIG. 11 is a diagram showing the relationship of voltage with respect to the concentration of the wide-gap material.

Here, the material of the light-emitting layer ELL is defined as a host (HOST) and the wide-gap material is as a dopant (DOPANT). The horizontal axis in FIG. 11 represents the concentration of the dopant with respect to the total of host and dopant, and the vertical axis represents the voltage at a current density of 10 mA/cm$^2$. FIG. 11 shows the cases where the dopant concentrations are 0%, 40%, 50% and 60%, respectively. As the dopant concentration is higher, $\Delta E2$ is higher.

FIGS. 12 and 13 are each a diagram showing the V-I characteristics of the light-emitting layer containing the dopant used in FIG. 11. FIG. 12 shows the V-I characteristics in the recombination region, whereas FIG. 13 shows the V-I characteristics in the high current region.

In FIGS. 12 and 13, the V-I characteristics of the light-emitting layer having a low dopant concentration are referred to as PL1, and the V-I characteristics of the light-emitting layer having a high dopant concentration is referred to as PL 2. In the light-emitting layer ELL with a high dopant concentration, a high current value can be obtained even if the applied voltage is low. In other words, the light-emission efficiency of the light-emitting layer ELL is improved.

FIG. 14 is a diagram showing the thickness dependency of the light-emitting layer. FIG. 14 shows the cases of a light-emitting layer without the wide-gap material (NOT WIDE GAP) and a light-emitting layer containing the wide-gap material (WIDE GAP), respectively, when the film thicknesses are 30 nm and 40 nm in each case.

As shown in FIG. 14, when the film thickness is 30 nm or more and 40 nm or less, the voltage V is approximately constant. In other words, at film thicknesses in this range, there is no thickness dependency of the voltage V. Thus, the film thickness of the light-emitting layer ELL should preferably be 30 nm or more and 40 nm or less.

Although this embodiment is directed to a display device including a light-emitting layer ELL containing a wide-gap material, but the present invention is not limited thereto. Such a light-emitting layer ELL and an organic EL layer ELY including the light-emitting layer ELL can be applied to, in addition to display devices, for example, laser light sources of laser irradiation devices, photodiodes, optical switches, and the like. An example of the photodiodes is avalanche photodiodes, and an example of the optical switches is a supersaturated absorption optical switch.

In this embodiment, the light-emitting layer ELL is made wide-gap, and thus it is possible to suppress carriers from flowing out of the light-emitting layer ELL. In this manner, the light emission efficiency of the light-emitting layer ELL can be improved, and the lifetime in light emission of the light-emitting layer ELL can be enhanced.

Configuration Example 1

FIG. 15 is a diagram showing another configuration example of the display device in the embodiment. The configuration example shown in FIG. 15 differs from that of FIG. 7 in that the light-emitting layer is made narrow-gap.

Figure 16:
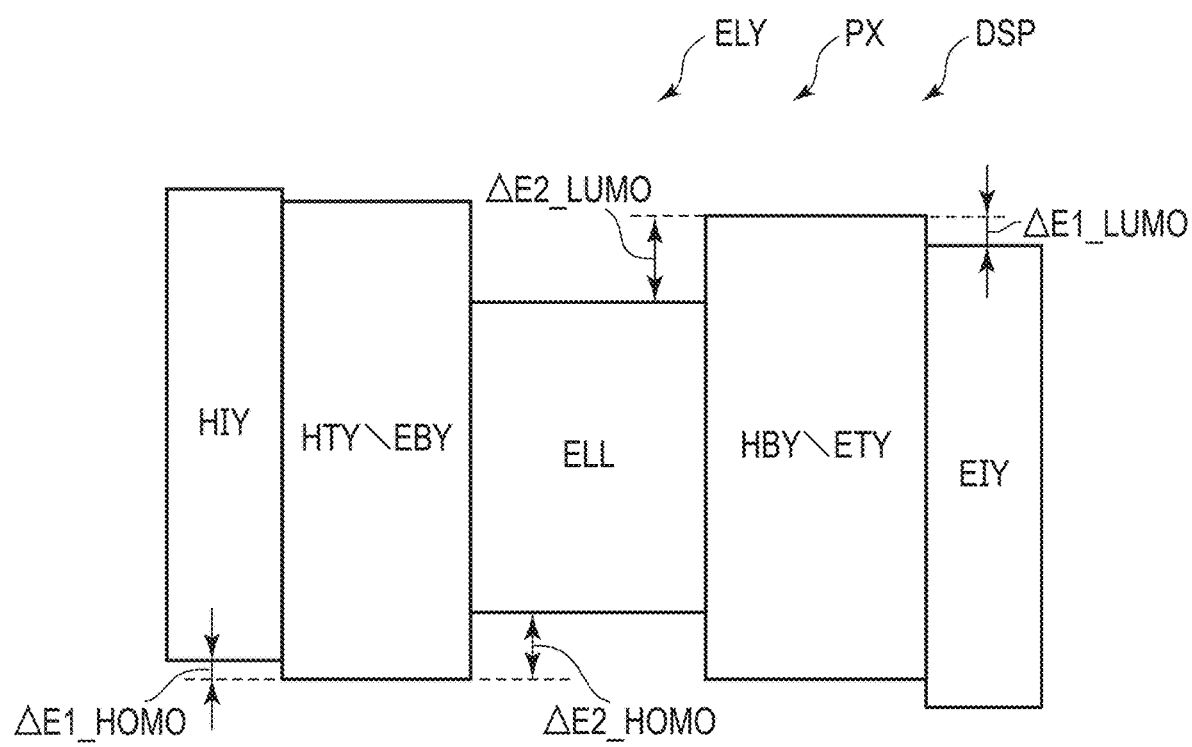
FIG. 16 is a diagram showing an energy band of a display device having a well-shaped structure of the configuration example 1.

FIG. 15 is a diagram showing the energy bands of the display device having a staggered structure of this configuration example. FIG. 16 is a diagram showing the energy band of the display device having a well-like structure of this configuration example.

In FIGS. 15 and 16, the HOMO level of the light-emitting layer ELL and the HOMO levels of the carrier transport layers adjacent thereto (the hole transport layer HTY and the electron transport layer ETY) are compared, and the HOMO level of the light-emitting layer ELL is higher. The LUMO level of the light-emitting layer ELL and the LUMO level of the carrier transport layers adjacent thereto (the hole transport layer HTY and the electron transport layer ETY) are compared, and the LUMO level of the ELL is lower.

In this configuration example as well, it is preferable that $\Delta E2$ ($\Delta E2\_LUMO$, $\Delta E2\_HOMO$) be 0.1 eV or more and 0.5 eV or less (0.1 eV$\leq \Delta E2 \leq$0.5 eV). When $\Delta E2$ is less than 0.1 eV ($\Delta E2 \leq$0.1 eV), carriers can easily flow. As a result, the lifetime in light emission of the exciton is prolonged and the efficiency is lowered.

Further, as in the embodiment, $\Delta E1$ ($\Delta E1\_LUMO$, $\Delta E1\_HOMO$) should preferably be 0.35 eV or less ($\Delta E1 \leq$0.35 eV).

In order to make $\Delta E2$ in the above range, a material which can make the emitting layer ELL narrow-gap (hereinafter referred to as a narrow-gap material) can be co-deposited when forming the emitting layer ELL. Further, in order to make $\Delta E2$ within the above range, it is necessary to select an appropriate material and an appropriate film thickness.

In this configuration example, by making the light-emitting layer ELL narrow-gap, it is possible to suppress the carriers from flowing out of the light-emitting layer ELL. Thus, the light emission efficiency of the light-emitting layer ELL can be improved and the lifetime in light emission can be enhanced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
   an anode;
   an organic EL element layer including a hole injection layer, a hole transport layer, an electron blocking layer, a light-emitting layer, a hole blocking layer, an electron transport layer and an electron injection layer; and
   a cathode, wherein
   $\Delta E2\_LUMO$ is defined as a potential barrier between the light-emitting layer and a first mixed layer of the electron transport layer and the hole blocking layer,
   $\Delta E2\_HOMO$ is defined as a potential barrier between the light-emitting layer and a second mixed layer of the hole transport layer and the electron blocking layer,
   each of the $\Delta E2\_LUMO$ and the $\Delta E2\_HOMO$ is 0.1 eV or higher and 0.5 eV or less,
   $\Delta E1\_LUMO$ is defined as a potential barrier between the electron injection layer and the first mixed layer of the electron transport layer and the hole blocking layer,
   $\Delta E1\_HOMO$ is defined as a potential barrier between the hole injection layer and the second mixed layer of the hole transport layer and the electron blocking layer, and
   each of the $\Delta E1\_LUMO$ and the $\Delta E1\_HOMO$ is 0.5 eV or less ($\Delta E1 <$0.5 eV).

2. The display device according to claim 1, wherein each of the $\Delta E1\_LUMO$ and the $\Delta E1\_HOMO$ is 0.35 eV or less.

3. The display device according to claim 2, wherein the $\Delta E1\_LUMO$ is 0.2 eV or less.

4. The display device according to claim 1, wherein a thickness of the light-emitting layer is 30 nm or more and 40 nm or less.

5. The display device according to claim 1, wherein a thickness of the light-emitting layer is 20 nm or more and 30 nm or less.

6. The display device according to claim 1, wherein the light-emitting layer is formed by co-evaporation.

* * * * *